(12) United States Patent
Mangiagli et al.

(10) Patent No.: US 6,320,258 B1
(45) Date of Patent: *Nov. 20, 2001

(54) SEMICONDUCTOR DEVICE HAVING ALTERNATING ELECTRICALLY INSULATIVE COATED LEADS

(75) Inventors: Marcantonio Mangiagli, Acireale; Rosario Pogliese, Gravina di Catania, both of (IT)

(73) Assignee: Consorzio per la Ricerca Sulla Microelectronica NEL Mezzogiorno (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/216,772

(22) Filed: Mar. 23, 1994

Related U.S. Application Data

(63) Continuation of application No. 07/872,777, filed on Apr. 23, 1992, now abandoned.

(30) Foreign Application Priority Data

Apr. 23, 1991 (IT) .............................................. CT91A0010

(51) Int. Cl.⁷ .................................................. H01L 23/04
(52) U.S. Cl. ......................... 257/730; 257/666; 257/668; 257/690; 257/691; 257/692; 257/693; 257/696; 257/725; 257/734; 257/787; 257/797; 257/798

(58) Field of Search .................................... 257/692, 696, 257/693, 690, 691, 666, 668, 725, 730, 734, 787, 797, 798

(56) References Cited

U.S. PATENT DOCUMENTS

| 4,617,585 | * 10/1986 | Yasui ................................. 257/730 |
| 4,951,124 | * 8/1990 | Sawaya ............................... 257/692 |
| 5,113,240 | * 5/1992 | Bozzini et al. ..................... 357/70 |

FOREIGN PATENT DOCUMENTS

| 0 098 051 | 1/1984 | (EP) . |
| 0 257 681 | 3/1988 | (EP) . |
| 0 418 891 A2 | 3/1991 | (EP) . |
| 418891 A2 | * 3/1991 | (EP) .............................. H01L/23/31 |
| 62282451 | 12/1987 | (JP) . |
| 63169050 | 7/1988 | (JP) . |
| 5550648 | * 4/1980 | (JP) ..................................... 257/666 |

* cited by examiner

Primary Examiner—Eddie Lee
Assistant Examiner—Matthew E. Warren

(57) ABSTRACT

A package for semiconductor devices is encapsulated in an insulating resin. Multiple conductive leads project from one side of the package. Alternating leads are provided with an insulating coating which projects along a portion of their length. Leads which are not insulated are bent so as to displace them from the plane of the coated leads and space them further away from the coated leads. The bent leads are displaced a sufficient distance to provide a separation in air consistent with spacing standards for high voltage devices.

16 Claims, 2 Drawing Sheets

SEMICONDUCTOR DEVICE HAVING ALTERNATING ELECTRICALLY INSULATIVE COATED LEADS

This is a Continuation-in-part of application Ser. No. 07/872,777, filed Apr. 23, 1992 now abandoned.

BACKGROUND OF THE INVENTION

1. Field of the Invention

The present invention relates to a semiconductor device encapsulated in resin and completely insulated for high voltages.

2. Description of the Prior Art

Semiconductor devices encapsulated in resin, completely insulated, and capable of resisting voltages up to 1500 V AC are known. An example of such a device is illustrated in U.S. Pat. No. 4,888,307. FIG. 12 of such patent is reproduced herein as FIG. 1.

Such devices are not suited for use in the range of high voltages, because, in such high ranges, they do not comply with international electrical insulation and safety standards. This is particularly true for very small electrically insulated packages containing semiconductor chips. An example of such a package is known internationally by the designation "TO 220". Other packages of the same dimensions have the same problem.

SUMMARY OF THE INVENTION

One object of the present invention is to provide a semiconductor device encapsulated in resin and completely insulated, capable of resisting high voltages of at least 2250 V AC. In one embodiment the invention proposes to provide devices with the same overall dimensions as the TO 220 device and capable of resisting voltages equal to or greater than 2250 V AC. This is done while fully complying with applicable international standards.

Another object is to provide a device which is economical, reliable, and safe.

Therefore, in accordance with the present invention, a package for semiconductor devices is encapsulated in an insulating resin. Multiple conductive leads project from one side of the package. Alternating leads are provided with an insulating coating which projects along a portion of their length. Leads which are not insulated are bent so as to displace them from the plane of the coated leads and space them further away from the coated leads. The bent leads are displaced a sufficient distance to provide a separation in air consistent with spacing standards for high voltage devices.

BRIEF DESCRIPTION OF THE DRAWINGS

To further clarify the innovative principles of the present invention and its advantages as compared with the known art, possible embodiments applying said principles are described below as non-limiting examples, with the aid of the annexed drawings.

In the drawings.

DESCRIPTION OF THE PREFERRED EMBODIMENT

In summary, the semiconductor device encapsulated in resin and completely insulated for high voltages in accordance with the present invention includes at least one chip of semiconductor material. The chip is encapsulated in a resin body acting as the covering, preferably with a first side designed to be place in contact with an external dissipator. A metallic heat dissipation plate may possibly be provided on this device. The package has several conductive leads emerging in succession from one side of the covering, with such leads having the following properties:

Alternately, in the order in which they appear along the side of the package, the conductive leads have their surface exposed or covered for a certain length by an insulating coating. Exposed leads have a bend at a selected distance from the resin body, while covered leads are encapsulated along their length by projections of the resin body for at least the selected distance.

Each conductive lead not provided with an insulating coating has a first bend in a direction opposite from the side designed to be placed in contact with the external dissipator. Each such lead also contains a second bend in the direction opposite to that of the first. The second bend occurs after a length along the conductor of a value such that the distance between the end of such conductive lead and the end of any nearby leads is not less than the limit which standards impose as the minimum distance in air between the conductive leads. Such minimum distance is made with reference to the maximum value of the insulation voltage the device is intended to assure.

In each conductive lead provided with an insulating coating, the section covered by the coating is selected to be a minimum length (L) greater than a distance from the body at which bends are formed in the other leads. L is selected so that the clearance and creepage distances between the lead and the nearby leads is not less than the values called for by standards for the maximum insulation voltage which the device is intended to assure.

The clearance and creepage distances between any two conductive leads not immediately adjacent are no less than the values called for by the standards.

Figure 1:
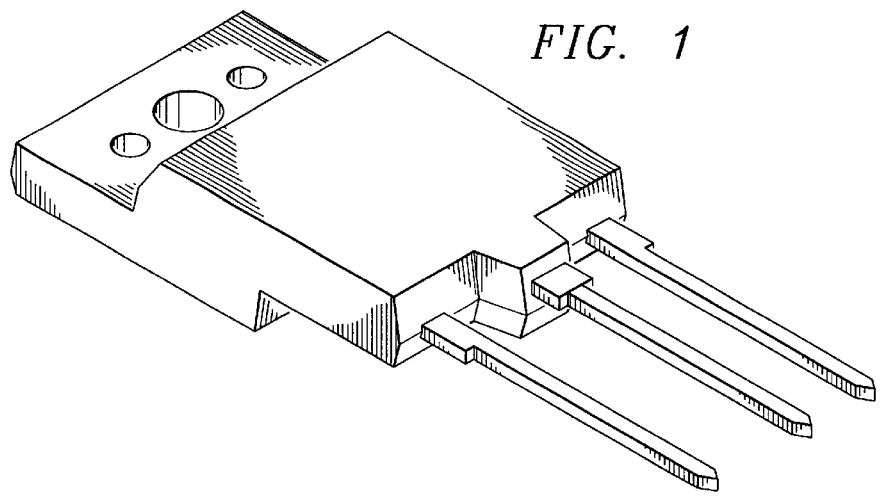
FIG. 1 shows a perspective view (not to scale) of an electrically insulated plastic power transistor in accordance with the known art.
Figure 2:
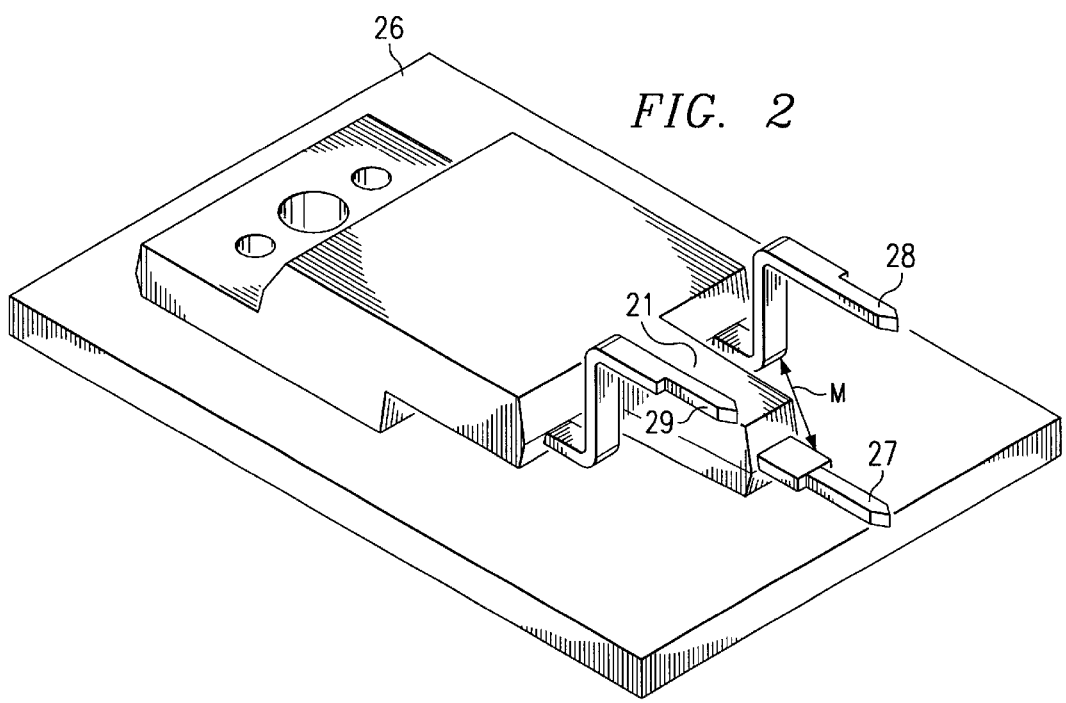
FIG. 2 shows a perspective view (not to scale) of an electrically insulated plastic device for high voltages in accordance with the present invention and placed in contact on a dissipator.
Figure 4:
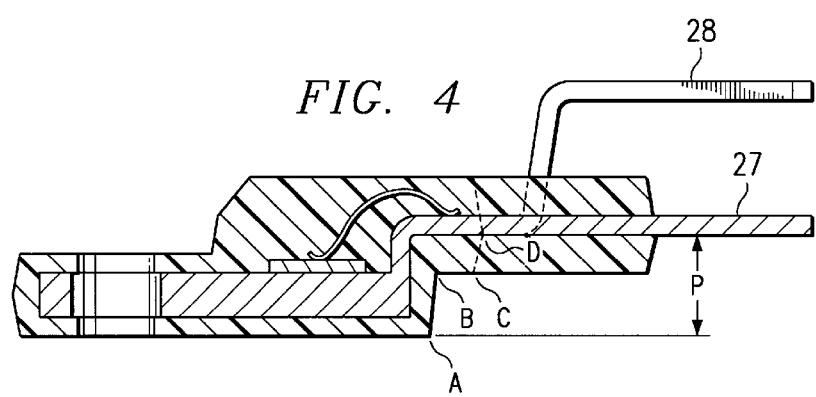
FIG. 4 shows a cross-section of the device shown in FIG. 2.
Figure 3:
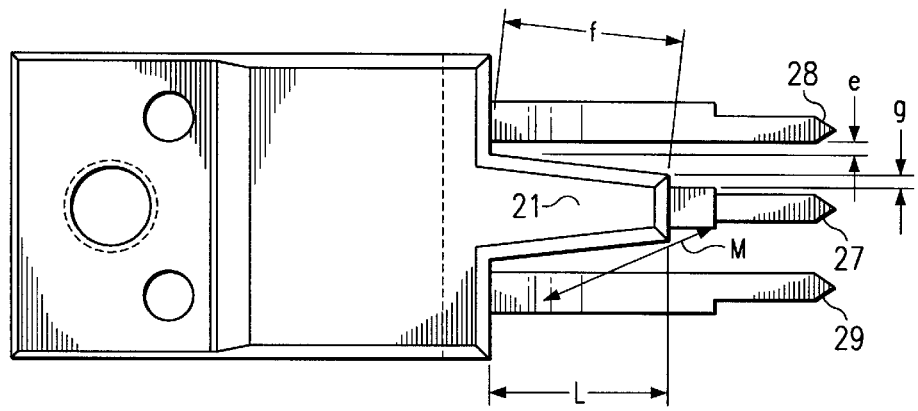
FIG. 3 shows a plan view of the device shown in FIG. 2.

FIGS. 2, 3, and 4 show perspective, plan and cross-section views, respectively, (not in scale) of an electrically insulated device suitable for use with high voltages in accordance with the present invention. The primary characteristics which distinguish the device concern the shape of the conductive leads 28 and 29, and the resin coating 21 of the central lead.

As regards the shape of the leads it will be apparent that they follow each other with their tips in a staggered position. The tip of a given lead lies on a horizontal plane different from that on which lie the tips of the immediately proceeding or immediately following leads. This occurs because the outside leads 28, 29 have two bends, almost at right angles, near the plastic covering. The leads have their tips on a plane parallel to the dissipator 26 and at a distance therefrom greater than the tip of lead 27 and the dissipator.

The distance between the two planes, i.e., the distance between the two right-angle bends of the side leads, is selected such that the distance between the end of the central lead and the ends of the side leads is not less than the limit which applicable standards impose on the clearance distance for the maximum insulation voltage which the device must withstand. The clearance distance is defined as the minimum distance in air between two conducting elements, i.e., between close leads and between leads and the external dissipator.

The coating 21 of the central lead is made of the same molding resin and during the mold transfer process as the remainder of the package. Its length L (FIG. 3) must meet primarily the following two dimensioning criteria.

In accordance with the first criteria, the length L must be such as to ensure that the minimum distance M in air between the central lead section nearest the coating 21 and the side lead sections between the two consecutive bends is not less than the clearance distance. In this manner the clearance distance imposed by standards is complied with for every part of two adjacent leads. The clearance distance is met not only between the ends of the leads, but also between the initial uncovered section of the central lead and the bend of the side leads.

In accordance with a second criteria, the length L must also be such as to ensure a creepage distance between the central lead and the adjacent leads not less than that imposed by the standard. The creepage distance is the shortest path between two leads, or between a lead and the external dissipator, measured along the surface of the package. In the case of FIG. 3, the creepage distance between the lead 27 and the lead 29 is N=e+f+g.

Since the minimum distances between the two side leads measured in air, and along the surface of the package, are also not less than the clearance and creepage distances respectively called for by the standards for the reference voltage, with the above dimensioning the clearance and creepage distances between any lead and the others is fully complied with. By way of example, in the case of a device with the same overall dimensions as a TO 220 device, the length L is 6 mm and allows clearance and creepage distances between the central lead adjacent leads of 5.3 mm and 7.4 mm respectively.

Therefore, the length L together with the particular conformation of the side leads allows clearance distances M and creepages distances N between the leads not less than those called for by the standards for voltage of 2250 V AC. The distances called for by the standards are 3.0 MM and 3.2 MM, respectively.

Referring to FIG. 4, the clearance and creepage distances of the leads in relation to the external dissipator 26 are illustrated as distances P and Q=a+b+c. Compliance with the standard values is achieved by appropriately selecting the values of P and b. Once P has been selected, the a+c portion of Q is no longer variable.

Again in the case of a device having overall dimensions the same as the TO 220 standard, the distance P is set at 3.1 mm and the distance B at 1.2 mm. This fully complies with the aforesaid values of 3.0 mm and 3.2 mm, respectively, prescribed by the standards for the clearance and creepage distances which the leads must meet with relation to the external dissipator as well as each other.

In the embodiment example described above, reference has been made to creepage and clearance which permit an electrical insulation of 2250 V AC. However, it will be apparent to those skilled in the art that the general criteria of dimensioning indicated above are applicable also when it is intended to ensure greater insulation voltages.

In the example of FIG. 2, the device rests on the external dissipator 26 and is electrically insulated therefrom. However, if installation of the device does not require the dissipator, because the device can be mounted in free air, the device can withstand greater insulation voltages than those indicated above. The clearance and creepage distances of 5.3 mm and 7.4 mm respectively, in the example described above, ensure an electrical insulation of at least 2800 V AC. The standard for such voltage calls for 4.2 mm and 5.0 mm clearance and creepage distances, respectively.

In conclusion, the above-described inventive characteristics taken together make it possible to provide an encapsulated semiconductor device completely insulated in resin and suitable for containing at least one bipolar transistor chip or other similar semiconductor device. The device thus packaged is capable of withstanding higher voltages, for given overall dimensions, than conventional devices.

Although a single preferred embodiment of the present invention has been illustrated and described, it will be apparent to those skilled in the art that numerous variations and modification can be made thereto without going beyond the scope of the present invention.

Figure 5:
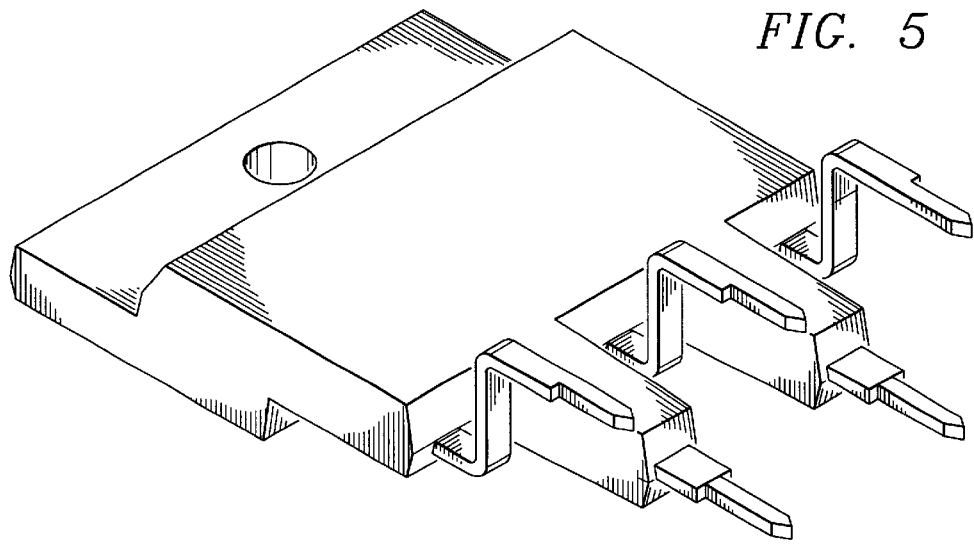
FIG. 5 shows a perspective view of another plastic device in accordance with the present invention.

For example, the solution described above is not necessarily limited to a device having three conductive leads, but can be extended to a device having more than three leads. For example, a five lead package may be fabricated, and an example of such a package for containing a five terminal circuit is illustrated in FIG. 5. The dimensioning criteria indicated for the three lead device is easily directly extended to devices having more than three leads.

Figure 6:
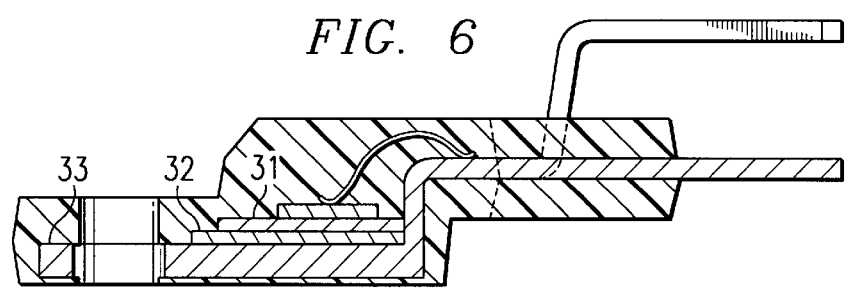
FIG. 6 shows a cross-section view of the device shown in FIG. 2 in accordance with a variation which calls for a heat-dissipating plate incorporated in the package.

As a further alternative, the encapsulated resin device, instead of having a cross-section as shown in FIG. 4, could have the cross-section of FIG. 6. In this device, the copper plate 31 is welded by means of an insulating layer 32 to a copper plate 33. The chip is directly welded to the copper plate 31 as known in the art. Insulating layer 32 preferably consists of material such as $Al_2O_3$, AlN, resin, and so forth. Copper plate 33 acts as a dissipator incorporated in the package, and may optionally be placed in contact with another external dissipating plate.

While the invention has been particularly shown and described with reference to a preferred embodiment, it will be understood by those skilled in the art that various changes in form and detail may be made therein without departing from the spirit and scope of the invention.

What is claimed is:

1. A package for an integrated circuit device, comprising:
   an insulating body containing the integrated circuit device; and
   a plurality of conductive leads projecting within a first plane from one side of the insulating body, each of the conductive leads having a tip distal from the insulating body,
   wherein the insulating body extends along alternating ones of the leads covering a portion of their length extending from the insulating body,
   the remaining leads each having a bend at a first distance from the insulating body angling the lead away from the first plane,
   wherein the insulating body extends along the alternating ones of the leads for at least the first distance, such that a distance between all uninsulated portions of any pair of leads is always at least a selected distance.

2. The package of claim 1, wherein each of the remaining leads has a second bend angling the lead into a second plane parallel to the first plane, each of the leads has a length sufficient to bring a tip thereof into a position coplanar with all of the other tips, and the tips of any pair of adjacent leads are separated by at least the selected distance.

3. The package of claim 2, wherein each of the bends in the leads has an angle of approximately 90°.

4. The package of claim 1, wherein the package has at least three conductive leads.

5. The package of claim 4, wherein the package has exactly three leads.

6. The package of claim 4, wherein the package has at least five leads.

7. The package of claim 6, wherein the package has exactly five leads.

8. The package of claim 1, wherein the package has three leads, wherein the alternating ones of the leads comprises a central lead of the three, and wherein the remaining leads comprises one lead spaced on either side of the central lead.

9. The package of claim 1, wherein a distance from a point where any one of the leads projects from the insulating body, measured along the insulating body to a surface of the insulating body suitable for mounting on a dissipating surface, is always greater than a second selected value.

10. An integrated circuit device package, comprising:
   an insulating body containing an integrated circuit device and including a projection extending within a first plane;
   a first conductive lead extending through and projecting from the insulating body projection, wherein a tip portion of the first conductive lead lies within the first plane; and
   a second conductive lead projecting from the insulating body and including, within a portion extending from the insulating body, a plurality of bends each altering a direction of projection of the second conductive lead, wherein a tip portion of the second conductive lead lies within a second plane substantially parallel to and spaced apart from the first plane,
   wherein the insulating body projection has a length greater than a length of the second conductive lead between the insulating body and the portion of the second conductive lead including the plurality of bends, and
   wherein a distance between exposed portions of the first and second conductive leads exceeds a selected distance.

11. The integrated circuit device package of claim 10, wherein the first and second conductive leads extend, at ends opposite the tip portions, within a single plane from a body on which the integrated circuit device is mounted.

12. The integrated circuit device package of claim 10, further comprising:
   a third conductive lead projecting from the insulating body and including, within a portion extending from the insulating body, a plurality of bends each altering a direction of projection of the third conductive lead, wherein a tip portion of the third conductive lead lies within the second plane.

13. The integrated circuit device package of claim 12, wherein a portion of the first, second, and third conductive leads all lie within a single plane with the first conductive lead between the second and third conductive leads.

14. The integrated circuit device package of claim 12, further comprising:
   a second projection of the insulating body within the first plane, the second protection having a length equal to the length of the first projection;
   a fourth conductive lead extending through and projecting from the second insulating body projection, wherein a tip portion of the fourth conductive lead lies within the first plane; and
   a fifth conductive lead projecting from the insulating body and including, within a portion extending from the insulating body, a plurality of bends each altering a direction of projection of the fifth conductive lead, wherein a tip portion of the fifth conductive lead lies within the second plane.

15. A connection structure for an integrated circuit device package, comprising:
   a plurality of leads extending from a insulating body and each including a portion extending within a single plane,
   wherein alternating leads within the plurality of leads include an end portion distal from the body which lies within a first plane, and
   wherein intermediate leads between the alternating leads include an end portion distal from the body which lies within a plane spaced apart from the first plane, the intermediate leads including a plurality of bends between the body and the end portion altering a projection of the respective intermediate leads, and
   wherein projections of the insulating body encapsulate the alternating leads for at least a length equal to the length of the intermediate leads between the insulating body and the plurality of bends.

16. The connection structure of claim 15, wherein the end portion of each intermediate lead is spaced apart from an end portion of a nearest other lead by a predetermined distance.

* * * * *